United States Patent
Butler et al.

(10) Patent No.: US 7,865,849 B2
(45) Date of Patent: Jan. 4, 2011

(54) SYSTEM AND METHOD FOR ESTIMATING TEST ESCAPES IN INTEGRATED CIRCUITS

(75) Inventors: Kenneth M. Butler, Richardson, TX (US); John M. Carulli, Jr., Richardson, TX (US); Jayashree Saxena, Richardson, TX (US); Amit P. Vasavada, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 386 days.

(21) Appl. No.: 12/032,557

(22) Filed: Feb. 15, 2008

(65) Prior Publication Data

US 2009/0210830 A1  Aug. 20, 2009

(51) Int. Cl.
*G06F 17/50* (2006.01)
(52) U.S. Cl. ......................................... 716/4
(58) Field of Classification Search .............. 716/4
See application file for complete search history.

(56) References Cited

U.S. PATENT DOCUMENTS

| | | | | |
|---|---|---|---|---|
| 5,539,652 A | * | 7/1996 | Tegethoff | 703/14 |
| 6,701,491 B1 | * | 3/2004 | Yang | 716/4 |
| 6,812,724 B2 | * | 11/2004 | Rao et al. | 324/763 |
| 7,512,508 B2 | * | 3/2009 | Rajski et al. | 702/118 |
| 7,539,893 B1 | * | 5/2009 | Ferguson | 714/6 |
| 2003/0171896 A1 | * | 9/2003 | Rao et al. | 702/183 |
| 2006/0066338 A1 | * | 3/2006 | Rajski et al. | 324/765 |
| 2006/0106555 A1 | * | 5/2006 | Voorakaranam et al. | 702/82 |
| 2007/0162242 A1 | * | 7/2007 | Singh et al. | 702/82 |
| 2007/0233629 A1 | * | 10/2007 | Balog | 706/47 |
| 2007/0234161 A1 | * | 10/2007 | Blanton et al. | 714/736 |

OTHER PUBLICATIONS

Butler, et al.; "An Empirical Study on the Effects of Test Type Ordering on Overall Test Efficiency;" Paper 15.2; Proc. 2000 IEEE; ITC International Test Conference; Oct. 2000; pp. 408-416.

* cited by examiner

*Primary Examiner*—Stacy A Whitmore
*Assistant Examiner*—Magid Y Dimyan
(74) *Attorney, Agent, or Firm*—Yingsheng Tung; Wade J. Brady, III; Frederick J. Telecky, Jr.

(57) ABSTRACT

A method for designing an integrated circuit including estimating a test escape rate for tests of interest, a test coverage calculator and a system for estimating a test escape rate for tests of interest associated with a portion of an integrated circuit (IC) die. In one embodiment the method includes the step of: estimating a test escape rate for a set of fault tests to be performed on an IC under design based on an estimated yield and a combined coverage of the set of fault tests; the combined coverage accounting for overlapping coverage among the set of fault tests.

18 Claims, 3 Drawing Sheets

| PARAMETER | ALL BINS | BIN 1 | BIN 2 | BIN 3 | BIN 4 | BIN 5 |
|---|---|---|---|---|---|---|
| TEST PARAMETER 1 | 92% | 100% | 100% | 100% | 80% | 80% |
| TEST PARAMETER 2 | 90% | 100% | 95% | 95% | 100% | 95% |
| TEST PARAMETER 3 | 100% | 100% | 100% | 100% | 100% | 100% |
| TEST PARAMETER 4 | 100% | 100% | 100% | 100% | 100% | 100% |
| TEST PARAMETER 5 | 75% | 100% | 50% | 100% | 50% | 20% |

| | | STUCK | STUCK | STUCK |
|---|---|---|---|---|
| | | 43.63% | 61.76% | 71.92% |
| TRANS | 24.51% | 5441 | 8067 | 9729 |
| TRANS | 33.76% | 9131 | 14187 | 17125 |
| TRANS | 41.16% | 12129 | 19054 | 23077 |
| TRANS | 46.57% | 14510 | 22601 | 27342 |
| TRANS | 51.16% | 16555 | 25477 | 30716 |

SYSTEM AND METHOD FOR ESTIMATING TEST ESCAPES IN INTEGRATED CIRCUITS

TECHNICAL FIELD OF THE INVENTION

The invention is directed, in general, to testing of semiconductor devices and, more specifically, to a system and method for estimating a test escape rate of tests of interest associated with integrated circuit (IC) die.

BACKGROUND OF THE INVENTION

Testing semiconductor devices can prevent the potentially considerable cost of packaging faulty integrated circuit (IC) die in IC products such as processors. Nevertheless, it is not always feasible to use all test types on a given IC die due to considerations including design cost, product cost or tester memory limits. Thus, the level of test coverage for IC products can be an economic decision impacted by a number of different factors.

Test coverage, or fault coverage, represents a percentage of a type of fault model detectable during testing of an IC die. A high fault coverage, therefore, can be valuable during manufacturing test. High fault coverage numbers, however, usually require very careful design-for-test (DFT) implementations, large amounts of test generation time and pattern volumes, and long test times. Each of these can be costly and can prove intractable due to test resource limitations such as tester memory.

Different mathematical models have been used to assist in determining the feasibility of performing a specific test of interest for an IC die. The different mathematical models, such as the Williams and Brown Model, can be used for estimating test escape rates for a test of interest as a function of yield and fault coverage. A test escape rate, also known as time zero (T0) defective parts per million (DPPM), represents the risk that a chip (i.e., an IC die) will not function when tested as part of a multi-chip module (e.g., an IC product). A test escape rate of a proposed test is often referred to as a defect level and is specified in terms of DPPM.

The Williams and Brown model, in addition to other conventional models, is a unidimensional model that generates a test escape estimate for a single test type while neglecting other tests. Typical test programs for IC products, however, include multiple tests of different types having overlapping failing unit detections. For example, IC manufacturers may employ tests which are either sourced from automatic test pattern generation (ATPG) software or are fault graded using fault simulation tests including but not limited to: stuck-at tests, transition tests and $I_{DDQ}$ tests. What would be useful in the art is a method or system that provides an improved model which can estimate the return on investment (ROI) for conventional test generation efforts in order for product designers and test engineers to perform trade-off analysis that can assist in the design of integrated circuits.

SUMMARY OF THE INVENTION

To address the above-discussed deficiencies of the prior art, one aspect of the disclosure provides a method for designing an integrated circuit. In one embodiment, the method includes estimating a test escape rate for a set of fault tests to be performed on an IC under design based on the estimated yield and a combined coverage of the set of fault tests taking into consideration the overlapping nature of the test set.

In another aspect, the disclosure provides a test coverage apparatus. In one embodiment, the test coverage apparatus includes: (1) a fault data processor configured to merge failure data and fault coverage data from a plurality of tests into merged fault data, wherein the failure data and fault coverage data are related to an IC die under design and (2) a combined coverage generator configured to generate a combined coverage for tests of interest based on user-provided fault coverages for the tests of interest and the merged fault data.

In yet another aspect, the disclosure provides a system for estimating a test escape rate for tests of interest associated with a portion of an IC die system. In one embodiment the system includes: (1) a test coverage calculator configured to generate a combined coverage for tests of interest based on fault data related to an IC die under design, wherein the fault data includes a combination of failure data generated from IC products related to the IC die under design and fault coverages from a plurality of failure tests associated with the IC products. The IC products may share a common process node with the IC die under design.

BRIEF DESCRIPTION OF THE DRAWINGS

For a more complete understanding of the invention, reference is now made to the following descriptions taken in conjunction with the accompanying drawings, in which.

DETAILED DESCRIPTION OF ILLUSTRATED EMBODIMENTS

The disclosure introduces a system and method for systematically gathering production test failure data on existing products, combining it with designer-generated fault coverage data from the test generation for IC die, integrating coverages from multiple test sources, and combining that result with other manufacturing data in order to provide test escape rate estimates. The disclosure details estimating the test escape rate for tests of interest based on product yield and multiple overlapping fault coverages of tests of interests. The disclosure recognizes, based on empirical evidence, that a definite relationship exists between the probability that a given defect is detected and the type of testing being used. The empirical evidence suggests that some defects are detectable by certain test types and not detectable by others. Typically, however, "overlap" exists wherein more than one test type can detect failures. The disclosure recognizes the overlap and takes into account the intricacies of defect detection behavior in order to improve the accuracy of test escape estimates which can be used to assist product designers and test engineers in performing trade-off analysis for test generation. Thus, the test escape rates can be used to assist in the design of ICs by providing a set of tests of interest and the level of testing for each of the tests of interest needed to achieve a desired DPPM. The designer can then optimize the set of tests to use in the design.

Figure 1:
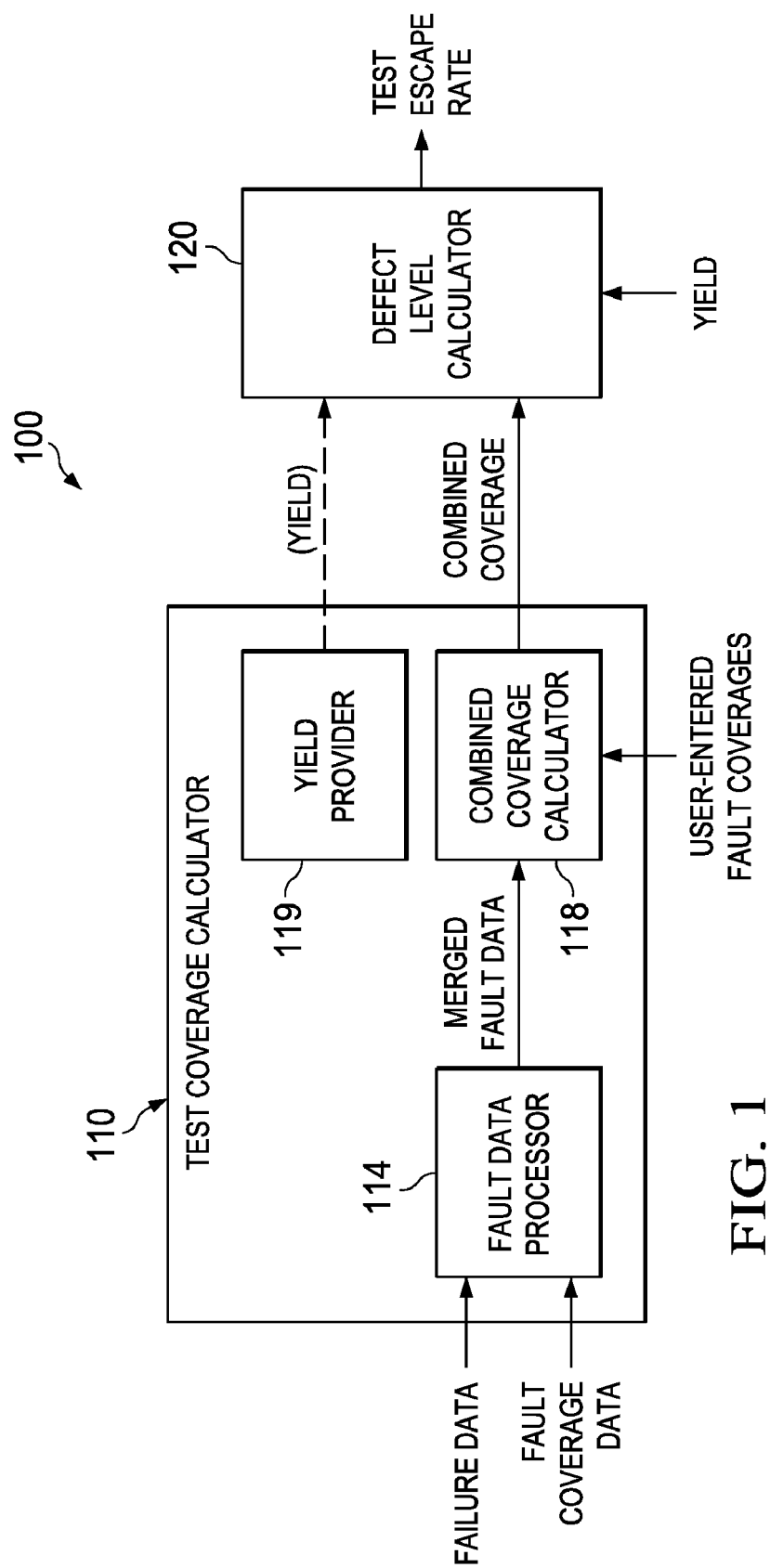
FIG. 1 illustrates a block diagram of an embodiment of a system for estimating a test escape rate for tests of interest associated with at least a portion of an IC die according to the principles of the disclosure.

FIG. 1 illustrates a block diagram of an embodiment of a system 100 for estimating a test escape rate for tests of interest associated with a portion of an IC die according to the principles of the disclosure. The portion of the IC die may be a logic portion. Other portions of an IC die (e.g., SRAM, analog, etc.) having applicable fault graded tests (i.e., coverage tests) may also be used.

The system 100 may be a dedicated apparatus constructed of special-purpose hardware employing a series of operating instructions which direct its operation. In alternative embodiments, the system 100 may be implemented on a general purpose computing device directed by a sequence of operating instructions to estimate the test escape rate. The system 100 includes a test coverage calculator 110 and a defect level calculator 120.

The test coverage calculator 110 is configured to generate a combined coverage for the tests of interest based on fault data generated from IC dies. The fault data includes a combination of failure data of at least one finished product related to the IC die under design and fault coverage data from a plurality of fault model tests associated with the finished product. The failure data may be results from various fault model tests performed on several products. A product may be a finished silicon product, such as a processor, in which the IC die under design is related to, such as a finished silicon product manufactured at the same process node. Typically, the fault model tests are generated by an automatic test pattern generation (ATPG) tool that is used to create patterns, and specifically a fault simulator that is embedded within the ATPG tool. Fault model tests include, for example: stuck-at tests, transition tests, $I_{DDQ}$ tests, bridging fault tests, small delay transition fault tests, stuck-open tests, in-line resistance fault tests, segment delay fault tests, and path delay tests. Each of these tests can be run at low voltage conditions, high voltage conditions, low temperature conditions and high temperature conditions. For the purpose of this disclosure, portions of a fault test are not to be construed as separate and different fault tests.

The test coverage calculator 110 includes a fault data processor 114 and a combined coverage generator 118. The fault data processor 114 is configured to merge failure data and fault coverage data from a plurality of fault model tests into merged fault data. The fault data processor 114 may also be configured to store the failure data and the fault coverage data. At least a portion of the failure data and the fault coverage data may be input into the fault data processor 114 by a user. In some embodiments, the fault data processor 114 may retrieve at least a portion of the failure data and the fault coverage from, for example, test equipment or stored testing data.

In some embodiments, the failure data is based on fault model tests that are performed at a sub-die level instead of a full die level. Accordingly, the fault data processor 114 scales the failure data with respect to a full area of the IC die. Additionally, the fault data processor 114 is configured to extrapolate the merged fault data to provide 100 percent fault coverage for its test types.

For most fault model tests such as structural tests, fault coverage is the metric that is reported, tracked, and maximized whenever possible. As noted above, the source of the fault coverage information is typically from an ATPG tool that is used to create patterns, and specifically a fault simulator that is embedded within the ATPG tool. This simulation information may be merged with the failure data from finished products in order to produce trend data for failures as a function of test quality.

ATPG tools usually employ a form of parallel pattern fault simulation, such as, parallel pattern single fault propagation. The fault coverage data is reported in increments corresponding to the word width of the computer performing the simulation, typically 32 or 64 bits. The fault data processor 114 merges the sequence of fault coverages with the failure data from failed tests. For some fault model test types, e.g., scan-based stuck-at or transition tests, the number of patterns (scan chain loads) can be large, even for modestly-sized circuits and even if on-chip compression techniques are used. Due to the possible size of the resulting pattern data, the pattern data for a single fault model test may be split into multiple files. The multiple files permit to-tester translations to be performed in parallel and permits easier test truncation when tester memory limits are reached.

The fault data processor 114 may organize the failure data such that a pass/fail indication for each pattern file in a test sequence is recorded. This can ease the merging of the failure data with the fault coverage data reported by the ATPG. The pattern file boundaries may not align with the fault simulator pattern increments for the fault coverage data. In this case, the fault data processor 114 may use linear interpolation, or other similar techniques such a polynomial interpolation, to determine the approximate coverage reached at the end of a particular pattern file. The errors introduced by this practice are generally small, particularly in the upper region of the coverage curve since the coverage gradient in this region is small. Alternatively, if the first failing scan load can be recorded for each pattern file, then it may be possible to increase the fault coverage resolution. However, doing so might necessitate either linear interpolation between ATPG report increments or re-simulating the patterns one-by-one so that each individual scan load's contribution to coverage is known. Several possible sources of discontinuities may result in the fault coverage versus failure data curve. For example, if the design being studied has multiple clocks, then the patterns might be created for each clock independently, particularly for transition fault testing, in order to avoid clock-race conditions and similar problems.

The combined coverage generator 118 is configured to generate a combined coverage for tests of interest based on user-provided fault coverages for the tests of interest and the merged fault data. The tests of interest may be fault model tests. For example, the tests of interest may be a scan-based stuck-at test having fault coverage of 98 percent, a scan-based transition test having a fault coverage of 90% and a scan-based $I_{DDQ}$ test having a coverage of 80%. The combined coverage generator 118 receives the inputted fault coverages and employs the fault coverages to generate the combined coverage. In some embodiments, the combined coverage generator 118 may interpolate the merged fault data to generate the combined coverage.

The test coverage calculator 110 also includes a yield provider 119. The yield provider 119 may obtain an estimated yield for the IC die by, for example, polling existing yield data or forecasting. The estimated yield can then be provided to the defect level calculator 120. The test coverage calculator 110 may employ a conventional yield model to forecast a yield for a new technology process to generate an estimated yield. In some embodiments, an estimated yield may be calculated external to the test coverage calculator 110 and supplied to the defect level calculator 120.

The defect level calculator 120 is configured to estimate the test escape rate for the tests of interest based on the estimated yield for the IC die and the combined coverage. The defect level calculator 120 may receive the estimated yield via user input. Additionally, the defect level calculator 120 may receive the estimated yield that was calculated by the test coverage calculator 110. The defect level calculator 120 may be or may operate as a defect level model such as a Williams and Brown model. The defect level calculator 120 may also be another defect level model such as, the Wadsack model, the Seth and Agrawal model, and the Test Transparency model of McCluskey and Buelow.

Employing the test coverage calculator 110 and the defect level calculator 120 allows a designer to optimize a set of fault tests needed to obtain a desired test escape rate. For example, if the above fault coverage levels of 98%, 90% and 80% for the respective fault tests did not provide the desired test escape rate, then the fault coverage levels could be manipulated until the desired test escape rate is provided by the defect level calculator 120. In some embodiments, any one of the fault coverage levels may be reduced and still obtain the desired test escape rate. Thus, a designer may reduce the coverage level of the particular fault model tests and still obtain the desired test escape rate.

Figure 2:
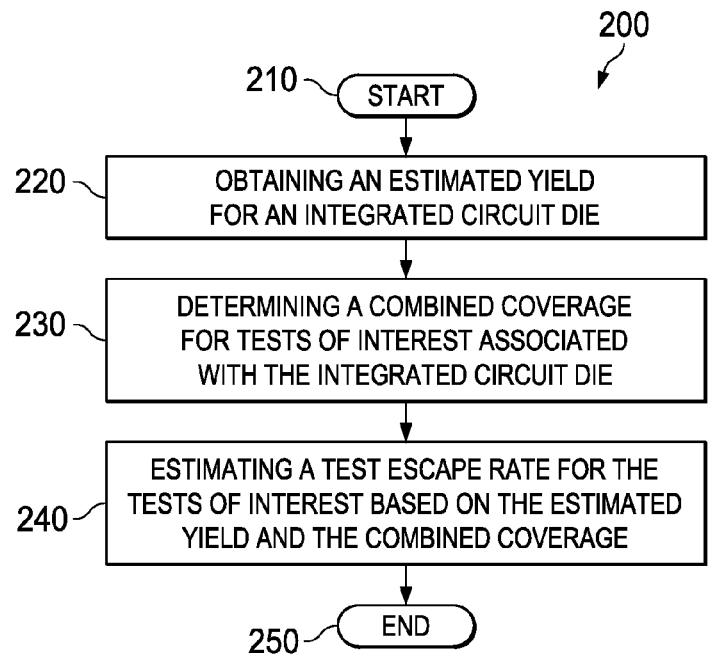
FIG. 2 illustrates a flow diagram of an embodiment of a method for designing an integrated circuit including estimating a test escape rate carried out according to the principles of the disclosure.

FIG. 2 illustrates a flow diagram of an embodiment of a method 200 for designing an integrated circuit including estimating a test escape rate carried out according to the principles of the disclosure. The method 200 may be implemented as a series of operating instructions that direct the operation of a computing device. The method 200 may be carried out by the system 100 of FIG. 1. The method 200 begins in a step 210 with the intent to design an integrated circuit.

After beginning, an estimated yield for an IC die is obtained in a step 220. The estimated yield may be obtained automatically based on manufacturing data. For a user-specified technology node, manufacturing data can be polled to obtain the estimated yield for a die of the same area provided by the user. For technologies not yet manufactured, a forecasted yield model can be applied based on historic data. In some embodiments, a user can provide a yield estimate if desired. A no-defect yield may be used to determine the estimated yield. Thus, the estimated yield may be automatically obtained from empirical data, generated based on historical data or received via input from a user. The estimated yield may be adjusted to account for the fact that yield estimates are full die but the tests may apply to a portion of the die.

Though yield can be a complex quantity, it is tracked in many manufacturing situations. Yield can vary depending on such factors including, maturity of the technology, the size of the device being manufactured and defective equipment. Deriving yield information from current or past experience works well for relatively mature processes for which large volumes of manufacturing data exist. For example, yield can be tracked by process technology based on die size.

For as-yet-unavailable process technology, determining a test escape rate as disclosed herein is also advantageous. In such cases, conventional yield models may be necessary such as the negative binomial and its variants. Typically assumptions must be made or early data gathered which characterize defect density, defect clustering or both. Additionally, the yield should be estimated for the portion of the die corresponding to the model. Thus, if only a logic portion of the IC die is characterized with coverage data, then the die area for the logic should be used to produce the yield estimate. Further, it may be the case that only a subset of the logic tests have known coverages, and there could be other types of testing for which no coverage data exists, such as functional tests. If so, then it may be necessary to adjust the yield term or otherwise compensate for the fact that there might be a population of defects that are detected only by the ungraded tests. Estimates for further DPPM reduction beyond what the model predicts might have to be made using more anecdotal information.

Figure 3:
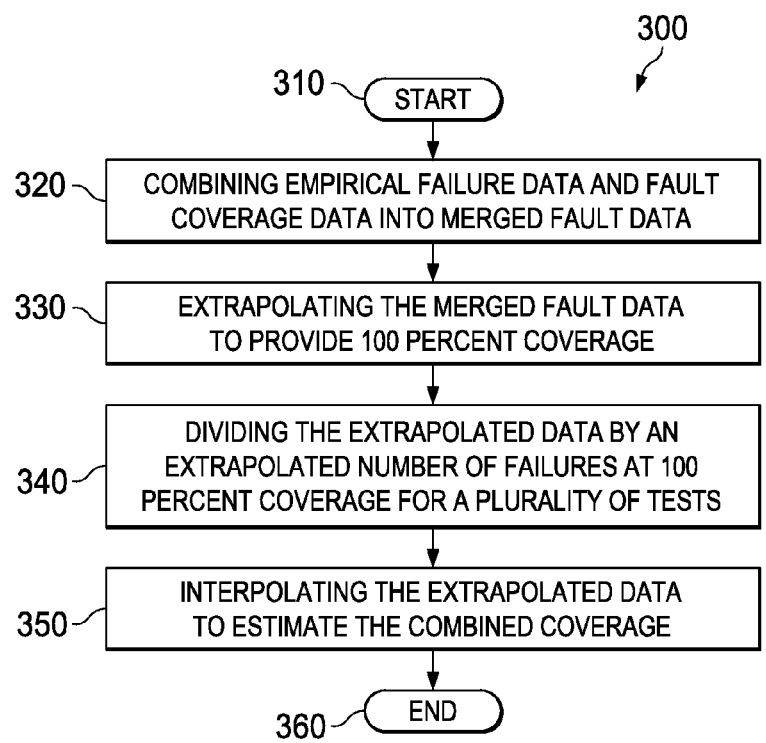
FIG. 3 illustrates a flow diagram of an embodiment of a method for determining a combined coverage for tests of interest carried out according to the principles of the disclosure.

The method 200 continues with determining a combined coverage for tests of interest in a step 230. The combined coverage is based on fault data related to the IC die and characterizes overlapping of the fault data. The combined coverage characterizes the overlapping by considering, for example, a combination of empirical failure data from production tests of existing products and designer-generated fault-coverage data from a plurality of structured tests performed on the existing products. Thus, unlike a fault coverage for a particular test of interest that only represents the coverage of that particular test, the combined coverage considers the fault coverages of a plurality of tests. The tests of interest may be fault model tests. FIG. 3 and the corresponding discussion provide additional information on determining a combined coverage.

After determining the combined coverage, a test escape rate for the tests of interest is estimated based on the estimated yield and the combined coverage in a step 240. The test escape rate can be estimated employing a conventional defect level model. For example, a Seth and Agrawal model or a Williams and Brown model may be used. The method 200 then ends in a step 250.

FIG. 3 illustrates a flow diagram of an embodiment of a method 300 for determining a combined coverage for tests of interest carried out according to the principles of the disclosure. The method 300 may be computer-implemented as a series of operating instructions that direct the operation of a computing device. The method 300 may be performed by a test coverage calculator such as the test coverage calculator 110 of FIG. 1. The method 300 begins in a step 310 with an intent to determine the combined coverage.

Empirical failure data and fault coverage data related to an IC die under design are next combined into merged fault data in a step 320. The empirical failure data and the fault coverage data may be associated with a logic portion of the IC die. For the merged fault data to characterize test effectiveness and test redundancy (detection overlap), there are a number of considerations to address. The first consideration is that the failure data represents the earliest possible test insertion point, preferably at wafer probe. To collect failure data any further downstream in the wafer testing can result in failure data that is "censored." In other words, IC dies that failed upstream tests will have been discarded. Neglecting the failure data from those IC dies can result in erroneous conclusions about the effectiveness of tests at earlier test points.

A second important consideration is that the failure data represent a continue-on-fail (COF) paradigm. Typically, volume production test programs implement a stop-on-fail (SOF) approach, meaning that execution of a test program ceases when the first test failure is detected. The obvious problem with SOF is that information is lost about tests that reside beyond the point of program failure. While a SOF approach does provide useful information about a product, a COF approach provides additional information that is useful when trying to obtain accurate DPPM measurements. Multi-site testing during wafer probing may be used to reduce the cost of obtaining the COF failure data. In multi-site testing, multiple dies are tested each time the wafer is contacted which can minimize the test-time impact of COF testing on any failing die that might be contacted at the same time.

In one embodiment, the COF failure data are organized as per-pattern-file failure information for each of the plurality of tests. Additionally, "first failing pattern" information may be collected for at least the first pattern file and, in some embodiments, for all of the pattern files.

Figures 4, 5, 6:
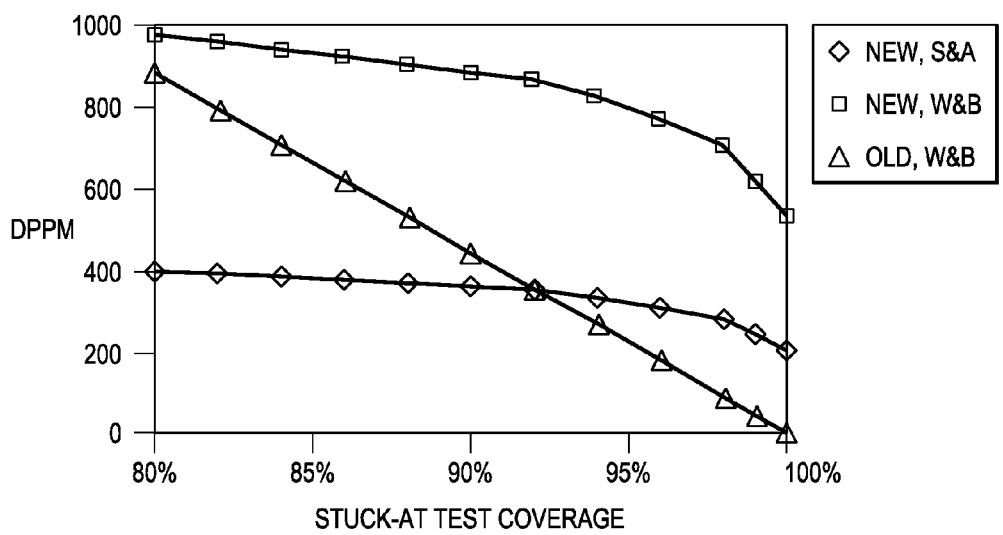
FIG. 4 illustrates an embodiment of a table employed to verify the integrity of empirical failure data used to estimate the test escape rate.
FIG. 5 illustrates an embodiment of a table representing combined coverage from multiple tests of interest.
FIG. 6 illustrates a graph including a plot representing a comparison between the outputs of defect level calculators including a defect level calculator constructed according to the principles of the invention.

In addition to having accurate failure data, the empirical failure data need to be as complete as possible. To verify the integrity of the failure data, the method 300 systematically analyzes the completeness of the failure data and discards at least portions of the data that are either erroneous and/or incomplete. FIG. 4 provides an example of a table employed to verify the integrity of empirical failure data. Depending on the test data sample size, any missing test results can magnify the prediction error significantly. Missing data items can occur for many reasons such as errors in the test program, data buffering problems on the tester, and data being lost while it is migrated from the tester to the data storage facility.

To verify the integrity of the failure data, samples of the data are analyzed to check for completeness. FIG. 4 represents all test parameters stored for a failure data sample of IC dies and the presence or absence of the test parameters relating to each of the samples. The test parameters represent the outcomes, such as pass, fail or a value for a measured current, from various tests. The units (e.g., IC dies) in the sample are separated according to tester bins that represent a pass or fail category to which the units are assigned after testing is complete. FIG. 4 shows partial results for a small number of parameters and bins. In this case, all five of the test parameters have entries (non-blank data) for all of the Bin 1 units. 20% of the Bin 4 and Bin 5 units are missing data for Test parameter 1.

The missing data from the table is analyzed to determine the appropriate action to take. For example, a determination is made if the data can be discounted, estimated or if a test program should be modified to provide more values. The generation of the table in FIG. 4 and the analysis of the data may be performed by a computer-implemented process. The fault data processor 114 of FIG. 1, for example, may be configured to generate the table and analyze the data included therein.

Returning now to FIG. 3, combining of the failure data and the fault coverage data includes ordering the fault coverage data according to generation and calculating cumulative failures based on the ordering. The fault coverage data are based on fault coverage logs generated by an ATPG tool, which characterizes per-pattern coverage in increments for fault model tests. For system on chip (SoC) designs with per-block tests, fault lists are determined to be mutually exclusive. If not, the calculations are adjusted. In some embodiments, linear interpolation, or a similar technique, is used to provide alignment for the ATPG pattern increments and the pattern file increments of the failure data. A table may be created to combine the fault coverages of the various fault model tests at each pattern file increment. The various fault model tests may include, for example, stuck-at tests, transition tests and $I_{DDQ}$ tests.

A cumulative failure curve for the test of interest based on the failure data can be obtained by ordering a set of related tests and then counting the number of units that passes tests 1, 2, . . . , N−1 and fails test N. When considering COF failure data, the tests may be ordered in any arbitrary way and the curve can still be calculated. Typically, the patterns are ordered in either the order in which the patterns were generated or the order in which the patterns were applied to the IC dies. If those two orders coincide, the situation is even more straightforward. Additional information on the calculation of cumulative failure curves can be found in "An Empirical Study on the Effects of Test Type Ordering on Overall Test Efficiency," by Butler, et al., Proc. 2000 IEEE Int. Test Conf., pp. 408-416, October 2000, incorporated herein by reference in its entirety.

The cumulative failure curves based on the ordered fault data represent the amount of fallout (i.e., failures) seen at increments of fault coverage. These results, however, correspond to only a single fault test type and do not take into account the other fault tests being measured. To combine the results and obtain the overall fallout response for the set of measured coverages, it is necessary to iteratively re-process the data. Assuming that fallout is measured on a per-pattern-file basis as described earlier, the data set is queried to determine the total fallout while sequencing through each of the pattern files. FIG. 5 illustrates a table that represents the re-processing of the data for two test-types.

FIG. 5 illustrates a partial table representing simulated data from a simple benchmark circuit. In this case, the table includes stuck-at coverage in the columns and transition fault coverage in the rows. The entries in the table are the total numbers of faults that were detected either by the stuck-at test or the transition test at the corresponding point. For example, 5441 represents the union of the number of faults detected by a stuck-at coverage at 43.63% and transition coverage at 24.51%. In the method 300, the coverage entries correspond to the coverages at the pattern file boundaries, and the data entries in the table are the raw numbers of units detected by the combined tests at those boundaries, as measured from the collected data. If more than two test types are to be combined in this manner, a simple two-dimensional table is insufficient, and a multi-dimensional data representation should be used instead, such as, a multiplicity of two-dimensional tables, a hash table, a look-up table or a commercial database including an Oracle® database distributed by Oracle Corporation of Redwood Shores, Calif.

After combining the empirical failure data and the fault coverage data, the merged fault data is extrapolated to provide 100 percent coverage in a step 330. The merged fault data may be fit into a model and then extrapolated to 100 percent coverage in all dimensions. Coverages seldom if ever reach 100% for any test type. Untestable faults, test pattern limits, and ATPG run time limits are among the reasons why "perfect" coverage cannot be obtained. However, to construct a model to be used in estimating future outcomes, it is desirable to have coverage information that extends to 100% on all coverage axes. Even if 100% coverage were reached, it might be desirable to extrapolate beyond 100% if N-detect or similar types of testing were to be employed, though it would be more desirable to characterize the contribution of N-detect testing empirically.

To accomplish this goal, a best fit model for the data is selected using minimum least squares or similar methods. The existing data may be fit into different types of mathematical models (linear, quadratic, cubic, exponential, etc.) and the best fit model selected therefrom. A model that is linear in all coverage terms is selected in some embodiments.

After the best fit model is determined, the model is used to extrapolate the empirical failure data out to 100% for all coverages. To produce monotonically increasing predictions, the best fit model may be modified to prevent predicting lower fallout than empirical data at the next lower measured coverage number.

The extrapolated data is then divided by an extrapolated number of failures at 100 percent coverage for a plurality of test in a step 340. Once the extrapolation process is complete, the number of units at the maximum coverage of all tests is chosen to be the total number of units detectable by all tests combined and at their highest coverage. This number is used as the denominator for every table entry in a new table which then characterizes the "combined coverage" of all of the tests at that set of coverage points.

The combined coverage is then estimated in a step 350 by interpolating the extrapolated data. For fault coverage numbers of tests of interests represented by the extrapolated data, interpolation is performed within the extrapolated data to estimate the combined coverage at the fault coverage numbers. The fault coverage numbers may be provided by a user for the particular tests of interest. Thereafter, the method 300 ends in a step 360.

FIG. 6 illustrates an embodiment of a graph including a plot comparing the outputs of defect level calculators. The graph includes a plot of a conventional Williams and Brown defect level model applied iteratively which assumes independence among tests. This conventional model is compared to a Seth and Agrawal estimate using a combined coverage and a Williams and Brown model using a combined coverage. $I_{DDQ}$ and transition coverages are both arbitrarily chosen to be 80% and stuck-at coverage is varied from 80-100%.

At 100% stuck-at coverage, and regardless of the other coverages, the conventional model would predict zero DPPM, due to the fact that coverage overlaps and unique detections were not accounted for in the model explicitly. However, this is an inaccurate estimate since experience shows that there are always classes of defects that are not detected by stuck-at testing but are detected by the other test types, transition and/or $I_{DDQ}$, for example. The models according to the disclosure reflect a non-zero DPPM estimate even at 100% stuck-at coverage, which is as expected. Similar outcomes can be seen if $I_{DDQ}$ coverage or transition coverage is swept while fixing the other two coverages.

The disclosure provides determining a test escape rate for n>1 tests of interest. The disclosure cites the sources of empirical test data and recognizes the inherent overlaps in the various test types such as fault model tests. Additionally, the disclosure indicates how the failure data are merged with coverage information from the test generation processes, and how these merged reports are further combined to give overall product coverage for multiple test types. Next, the disclosure explains how data fitting is used to extrapolate the model beyond the limits of the coverages achieved on the product being studied. Finally, the disclosure combines the extrapolation model with production yield information in order to provide an automated tool for test escape estimation. The test escape estimation can be used in the design of integrated circuits by allowing designers to determine the set of and level of fault model testing needed to achieve a desired DPPM.

The above-described system, apparatus and methods may be embodied in or performed by various conventional digital data processors or computers, wherein the computers are programmed or store executable programs of sequences of software instructions to perform one or more of the steps of the methods, e.g., steps of the method of FIGS. 2-3. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIGS. 2-3.

Those skilled in the art to which the invention relates will appreciate that other and further additions, deletions, substitutions and modifications may be made to the described embodiments without departing from the scope of the invention.

What is claimed is:

1. A method for designing an integrated circuit (IC) die, comprising the step of:
    combining failure data and fault coverage data from a plurality of fault tests of interest related with said IC die under design into a fault data processor and generating merged fault data,
    incorporating said merged fault data into a model and extrapolating said merged fault data for 100 percent coverage,
    combining the extrapolated fault data with fault coverage data in a combined coverage calculator and generating a combined coverage data;
    combining the combined coverage data and yield data in a defect level calculator;
    calculating a test escape rate for the set of fault tests to be performed on an IC under design based on the yield data and the combined coverage data of said set of fault tests of interest; said combined coverage accounting for overlapping coverage among said set of fault tests of interest.

2. The method as recited in claim 1 wherein said fault coverage data is based on fault coverage logs generated by an automatic test pattern generator which characterizes per-pattern coverage in increments.

3. The method as recited in claim 1 wherein said combining failure data and fault coverage data step includes ordering said fault coverage data according to generation and calculating cumulative failures based on said ordering.

4. The method as recited in claim 1 wherein said failure data includes per-pattern-file failure information for each of said plurality of fault tests of interest.

5. The method as recited in claim 1 further including converting said extrapolated data to said combined coverage by dividing said data by an extrapolated number of failures at 100 percent coverage for all of said plurality of fault tests on interest.

6. The method as recited in claim 5 further including interpolating said converted extrapolated data to estimate said combined coverage for said fault tests on interest.

7. The method as recited in claim 1 wherein the yield data are generated by one of the actions selected from the group consisting of:
    obtaining from empirical yield data, and
    generating a forecasted yield based on historical data, and
    receiving a user-defined yield.

8. The method as recited in claim 1 further comprising scaling said failure data based on a level of testing.

9. The method as recited in claim 1 wherein said plurality of fault tests is selected from the group of fault tests on interest consisting of:
    a stuck-at test,
    a transition test,
    an IDDQ test,
    a bridging fault test,
    a small delay transition fault test,
    a stuck-open test,
    an in-line resistance fault test,
    a segment delay fault test, and
    a path delay test.

10. The method as recited in claim 1 wherein the calculating step uses a defect level model selected from a group of mathematical models consisting of: a Seth and Agrawal model, and a Williams and Brown model.

11. The method as recited in claim 1 wherein a portion of said IC die is a logic portion thereof.

12. The method as recited in claim 1 wherein at least a portion of said failure data is from continue-on-fail testing of IC die.

13. The method as recited in claim 1 wherein the fault data are verified to determine their integrity.

14. The method as recited in claim 1 further comprising optimizing a set of said fault tests of interest to obtain said test escape rate.

15. The method as recited in claim 1 wherein said fault tests of interest are fault model tests.

16. A test coverage calculator, comprising:
- a fault data processor configured to merge failure data and fault coverage data from a plurality of tests into merged fault data, said failure data and fault coverage data related to an integrated circuit (IC) die under design; and
- a combined coverage generator configured to generate a combined coverage through interpolation of said merged fault data for tests of interest based on user-provided fault coverages for said tests of interest and said merged fault data.

17. A test coverage calculator as recited in claim 16 wherein said fault data processor is configured to extrapolate said merged fault data to provide 100 percent coverage.

18. A test coverage calculator as recited in claim 16 wherein said fault data processor scales said failure data with respect to an area of said IC die.

* * * * *